(12) United States Patent
Boe

(10) Patent No.: US 9,648,762 B2
(45) Date of Patent: May 9, 2017

(54) PRESSURE RESISTANT HOUSING FOR AN ELECTRIC COMPONENT

(75) Inventor: Ove Boe, Tanem (NO)

(73) Assignee: Siemens Aktiengesellschaft, München (DE)

( * ) Notice: Subject to any disclaimer, the term of this patent is extended or adjusted under 35 U.S.C. 154(b) by 544 days.

(21) Appl. No.: 14/241,648

(22) PCT Filed: Aug. 2, 2012

(86) PCT No.: PCT/EP2012/065173
§ 371 (c)(1),
(2), (4) Date: Aug. 14, 2014

(87) PCT Pub. No.: WO2013/029916
PCT Pub. Date: Mar. 7, 2013

(65) Prior Publication Data
US 2014/0374132 A1    Dec. 25, 2014

(30) Foreign Application Priority Data

Aug. 30, 2011 (EP) .................................. 11179252.9

(51) Int. Cl.
| | |
|---|---|
| H05K 5/00 | (2006.01) |
| H01H 85/17 | (2006.01) |
| H01H 85/00 | (2006.01) |
| H01H 85/165 | (2006.01) |
| H01H 85/175 | (2006.01) |
| H05K 5/02 | (2006.01) |
| H01H 85/042 | (2006.01) |

(52) U.S. Cl.
CPC ....... *H05K 5/0095* (2013.01); *H01H 85/0013* (2013.01); *H01H 85/165* (2013.01); *H01H 85/17* (2013.01); *H01H 85/175* (2013.01); *H05K 5/0004* (2013.01); *H05K 5/0239* (2013.01); *H01H 85/042* (2013.01)

(58) Field of Classification Search
None
See application file for complete search history.

(56) References Cited

U.S. PATENT DOCUMENTS

| | | | |
|---|---|---|---|
| 3,450,948 A | 6/1969 | Gerlach et al. | |
| 3,586,914 A | 6/1971 | Foitzik et al. | |
| 5,103,203 A * | 4/1992 | Huber | H01H 85/157 337/205 |

(Continued)

FOREIGN PATENT DOCUMENTS

| | | |
|---|---|---|
| CN | 2034737 U | 3/1989 |
| DE | 2932570 | 11/1980 |

OTHER PUBLICATIONS

Chinese Office Action for related Chinese Application No. 201280042558.5, dated Jun. 9, 2015 with English Translation.
(Continued)

*Primary Examiner* — Dimary Lopez Cruz
(74) *Attorney, Agent, or Firm* — Lempia Summerfield Katz LLC

(57) ABSTRACT

A pressure resistant housing for an electric component is provided. The pressure resistant housing is adapted for the use in a subsea application. A ceramic housing body houses the electric component. The ceramic housing body has a first opening and a second opening that are closed by a first metal lid and a second metal lid, respectively.

20 Claims, 3 Drawing Sheets

(56) References Cited

U.S. PATENT DOCUMENTS

| | | |
|---|---|---|
| 5,166,677 A | 11/1992 | Schoenberg |
| 2009/0021339 A1 | 1/2009 | Haas et al. |
| 2009/0045906 A1 | 2/2009 | Stanek et al. |

OTHER PUBLICATIONS

European Search Report in European Patent Application No. 11179252.9, dated Mar. 28, 2013, 8 pages.
International Search Report and Written Opinion in PCT/EP2012/065173, dated Mar. 7, 2013, 13 pages.

* cited by examiner

PRESSURE RESISTANT HOUSING FOR AN ELECTRIC COMPONENT

The present patent document is a §371 nationalization of PCT Application Serial Number PCT/EP2012/065173, filed Aug. 2, 2012, designating the United States, which is hereby incorporated by reference in its entirety. This patent document also claims the benefit of EP11179252.9, filed on Aug. 30, 2011, which is also hereby incorporated by reference in its entirety.

BACKGROUND

The present embodiments relate to a pressure resistant housing for an electric component, such as a fuse or a fuse element. The present embodiments further relate to a subsea electric component and a subsea fuse.

Oil platforms are used in offshore oil and gas production. In the operation of offshore oil platforms, electronics may be installed under water, e.g., for controlling functions of a subsea Christmas tree or a subsea blow out preventer. More recently, processing facilities are being relocated to the ocean floor. Subsea installations may include processing equipment, such as electrically driven pumps, compressors, transformers, and switch gears. A subsea processing facility may include a power grid, as well as control, monitoring, and communication systems. The subsea installation may be located at water depths of up to 1000, 2000 or 3000 meters, and thus in the high pressures that prevail at such depths.

The equipment of the subsea installation may include components that are placed in pressure resistant canisters, enabling the use of standard components, such as pumps and electronics. The problem with such configurations is that the canisters have a considerable wall thickness in order to withstand the high pressures. Furthermore, electric connections to components inside the canisters are difficult to implement due to the large pressure differences between inside and outside the canister. An improvement uses pressurized enclosures, in which the inside pressure is matched to the outside pressure, e.g., by filling the canister with a liquid and providing a pressure compensator. Although such configurations address the problem of the canister wall thickness and high differential pressures, such systems limit the use of standard components. In particular, many conventional electric components are not suitable for operation under pressures of up to 300 bar. Consequently, new solutions may be developed, but the development work is cost and labor intensive.

It is desirable to be capable of using some standard electric components in a pressurized subsea application, and to avoid the costs and effort of developing subsea adapted components. For the above reasons, it is also desirable to avoid the use of pressure resistant canisters for providing an atmospheric environment, insofar as such canisters are heavy and expensive in production. Due to the volume and weight of such canisters, transport and installation costs for the canisters are also excessive.

SUMMARY AND DESCRIPTION

The present embodiments may obviate one or more drawbacks or limitations in the related art. For example, the usability of electric components in subsea applications may be improved, a pressure resistant enclosure may be provided.

A pressure resistant housing for an electric component, such as a fuse or a fuse element, is useful in a subsea application. The pressure resistant housing includes a ceramic housing body for housing the electric component, the ceramic housing body having a first opening and a second opening. A first metal lid for closing the first opening in the ceramic housing body is provided, the first metal lid forming a fluid tight seal with the ceramic housing body at the first opening. Further, a second metal lid for closing the second opening in the ceramic housing body is provided, the second metal lid forming a fluid tight seal with the ceramic housing body at the second opening. The ceramic housing body provides electric insulation between the first metal lid and the second metal lid. Each metal lid provides an electric connection for electrically contacting the electric component inside the pressure resistant housing. The pressure resistant housing is adapted to be installed in a subsea application, in which the ambient pressure external to the pressure resistant housing is higher than the internal pressure inside the pressure resistant housing. The pressure resistant housing is adapted to maintain a predefined internal pressure up to a pressure difference of at least 10 bar between the internal pressure and the ambient pressure.

The pressure resistant housing may be configured to have a predefined internal pressure in the range between about 1 bar and about 5 bar and to maintain the predefined internal pressure up to a pressure difference of at least 10 bar between the internal pressure and the ambient pressure. The ambient pressure may for example be the pressure that is prevalent inside a pressure compensated enclosure of a subsea application (or device) when the subsea application is installed subsea (at the ocean floor). Pressure compensated enclosure is used herein to indicate that the pressure inside the enclosure is substantially equal to the pressure outside the enclosure, e.g., the pressure inside the enclosure is balanced to the pressure in the surrounding sea water. The pressure resistant housing may, for example, be configured to maintain the predefined internal pressure when exposed to an ambient pressure within the range of 10 bar to about 100 bar, 200 bar, or 300 bar.

Use of a ceramic housing body may provide good electrical insulation between the first and second metal lids, while at the same time, the size and weight of the ceramic housing body may be kept small. The ceramic material may exhibit good pressure resistance at considerable lesser weight than a metal enclosure. An electric component not to be exposed to high pressures may be installed in the housing and the housing may be installed in the subsea application, insofar as the housing is compact and only requires a small amount of space. The subsea application may thus be pressure compensated, leading to an overall compact size of the subsea application. Because a standard electric component may be used, the development of a custom subsea adapted electric component may be avoided, reducing the requisite development efforts and costs. Because metal lids may be used for contacting the electric component, feed through connectors may not be called for, thereby avoiding the sealing problems with such connectors at high pressure differences.

In an embodiment, the fluid tight seal may be a metallic seal, e.g., a metallic seal formed by soldering or brazing. The fluid tight seal may prevent the intrusion of external media, such as a dielectric liquid with which the pressure compensated housing of the subsea application may be filled. The subsea application may, for example, be a transformer, e.g., a transformer for an auxiliary power supply, a subsea switchgear, or a subsea variable speed drive. Due to the pressure resistance, the predefined internal pressure may be maintained up to larger depths of water. The predefined internal pressure may, for example, be a pressure in the range between 1 and 5 bar. The predefined internal pressure may be close to atmospheric pressure, e.g., between 1 and 1.5 bar. Standard electric components may thus be used.

In an embodiment, the ceramic fuse body is a cylindrical ceramic tube, the first and second openings being disposed at opposing first and second ends of the ceramic tube. With the shape for the pressure resistant housing, a good pressure resistance may be achieved, and assembly of the pressure resistant housing is also facilitated. The insertion of an electric component into the pressure resistant housing and the electric contacting of the electric component may be performed in a straight forward manner with such configuration.

The edges of the first and second openings in the ceramic housing body may be metalized. A continuous circumferential region around each opening may be metalized. The ceramic housing body may include a metal coating. The metalized region may be formed by the application of a refractory metal paint onto the ceramic surface and sintering of the ceramic housing body to bond the refractory metal layer into the ceramic housing body. A metal coaling may then be applied to the sintered metal layer, e.g., by nickel plating.

In one embodiment, a metalized region on the ceramic housing body may be formed by brazing a metallic layer onto the ceramic housing body. The ceramic housing body may thus include a brazed joint at each of the first and second openings.

With the metallization at the edges of the first and second openings, a hermetic joint may be established and persist for multiple (e.g., repeated) heating cycles. This enables the joining of the respective metal lid to the edge of the respective opening and the formation of a fluid tight seal, which may withstand high differential pressures.

In an embodiment, the end faces of at least one of the first and second ends of the cylindrical ceramic tube (e.g., both of the first and second ends) are metalized. The metalized end face provides a metalized annular face that abuts the respective first or second metal lid. The metallization may extend to other regions, e.g., to the outer wall of the cylindrical ceramic tube. Because the metal lids abut the metalized annular face, a metallic seal may be formed between the ceramic housing body and the respective metal lid, e.g. by soldering or brazing the respective metal lid to the metalized annular face.

At least one of the fluid tight seals (e.g., both of the fluid tight seals) may be formed by soldering, e.g., by brazing the respective metal lid to the metalized edge of the respective opening. Soldering or brazing may establish a metal seal capable of withstanding large pressure differences between the external pressure and the pressure inside the pressure resistant housing. The pressure resistant housing may be adapted to maintain the predefined internal pressure up to a pressure difference of at least 100, 200 or 300 bar. As mentioned above, the predefined internal pressure may be in a range between 1 and 5 bar, or may be close to one atmosphere. In one example, the pressure resistant housing is adapted to maintain the predefined internal pressure at pressure differences in the range of about 1 to about 200 bar.

In one embodiment, at least one of the fluid tight seals may be established by a threaded connection or a screw connection between the respective first or second metal lid and the ceramic housing body. Such configuration may further facilitate the assembly of the pressure resistant housing. As an example, a thread may be provided in the lid and a second matching thread may be provided at the edge of the ceramic housing body at the respective opening. The thread at the ceramic housing body may be a ceramic thread, or a metallic thread fixed to the edge of the opening, e.g., by the above mentioned process, such as by providing a metalized layer on the housing edge and brazing or soldering the thread thereto.

In one embodiment, at least one of the fluid tight seals may be established by a gasket between the ceramic housing body and the respective metal lid. The metal lid may be fixed to the ceramic housing body by a metallic flange. The metal lid and the respective end of the ceramic housing body may each be provided with a flange, and both flanges may be fastened toward one another by fastening members, such as screws, bolts and nuts, clamps, or rivets. A metallic flange may be fixed to the ceramic housing body in any of the above-described manners, e.g., by brazing.

In one embodiment, the pressure resistant housing may include a support element arranged in the ceramic housing body. The support element may be adapted to support the electric component in the ceramic housing body. The support element may provide a spacing between the electric component and the ceramic housing body. Via the support element, the electric component may be protected from shock or from vibration.

At least one of the first or second metal lids may include a connecting element on a side of the respective metal lid that faces the interior of the pressure resistant housing. The connecting element may provide an electric contact to the electric component. The connecting element may be selected from a group of a screw connection, a clamping element and a push-in connector. As an example, the screw connection may include a recess in the metal lid with an internal thread, into which the electric component is screwed. The push-in connector may include a recess in the respective metal lid and a flexible contact spring, the electric component being pushed into the recess to establish the electric contact.

The pressure resistant housing may at least partially be filled with nitrogen, $SF_6$ (sulfurhexafluoride), sand, silicon gel, a dielectric liquid, or any combination thereof. Electric insulation between the electric component and the pressure resistant housing may thus be improved. Furthermore, the electric component may be cooled, e.g., by heat transport from the electric component to the wall of the pressure resistant housing via the sand, silicon gel or the dielectric liquid. Furthermore, if a fuse or a fuse element is installed in the pressure resistant housing, the medium filled into the pressure resistant housing may prevent arcing or may accelerate the extinguishment of an arc when the fuse is triggered. Furthermore, by providing cooling for a fuse or fuse element, the current at which the fuse triggers may be increased.

In an embodiment, at least one of the first or second metal lids includes a test port adapted to enable the admission of a gas into the pressure resistant housing. The test port may be a through hole in the metal lid and may, for example, be used to test the quality of the fluid tight seals. As an example, via the test port, a gas such as helium may be introduced into the interior of the housing and the detection of the gas outside the pressure resistant housing may be used for testing the pressure resistant housing for leaks.

The ceramic material used for making the ceramic housing body may, for example, be alumina, zirconia or other similar materials.

In a further embodiment, a subsea electric component is provided for a subsea application. The subsea electric component includes a pressure resistant housing in any of the above-described configurations. The electric component is arranged in the pressure resistant housing.

The electric component arranged in the pressure resistant housing may be selected from a group comprising a fuse, such as a low or medium voltage fuse, a fuse element, such as a low or medium voltage fuse element, and a surge arrestor. Other electric components may also be arranged in the pressure resistant housing, such as electronic circuits, including, for example, semiconductor elements.

The electric component may have two electrical terminals, one electrical terminal being connected to the first metal lid and the other electrical terminal being connected to the second metal lid. Accordingly, each metal lid may act as a terminal for the electric component to facilitate contacting of the electric component.

The electrical terminals of the electric component may be connected to the first or second metal lid via a flexible connection strip, a metallic band or a push-in connector. Mounting of the electric component inside the pressure resistant housing and the closing of the lid may thus be facilitated, while a good electric contact with the lid closed last may be achieved.

As an example, a metal band may be screwed onto a terminal of the fuse and onto the metal lid. Due to the length of the metal band, the electric component may be inserted into the pressure resistant housing and may be brought into contact with the second lid, which is mounted to the ceramic housing body. The metal band may then be folded in and the other metal lid may be closed and mounted to the ceramic housing body (e.g., by brazing or soldering the metal lid to the metalized layer).

The other metallic lid may be connected to the electric component by a screw connection, a clamping element, a push-in connector or other connecting element, as mentioned above.

Again, the pressure resistant housing of the subsea electric component may be at least partially filled with nitrogen, $SF_6$, sand, silicon gel or a dielectrically liquid, or a combination thereof.

A further embodiment provides a subsea fuse for a subsea application. The subsea fuse includes a pressure resistant housing according to any of the above-outlined configurations and an electric component configured as a fuse element or a fuse arranged in the pressure resistant housing. The fuse or fuse element includes two electric terminals, one of which is electrically connected to the first metal lid and the other of which is electrically connected to the second metal lid. In an embodiment, the subsea fuse may be a low or medium voltage subsea fuse (e.g., having a low or medium voltage fuse or fuse element arranged in the pressure resistant housing). Again, as outlined above, the pressure resistant housing of the subsea fuse may be filled with nitrogen, SF6, sand, a silicon gel or a dielectric liquid.

The features of the embodiments mentioned above and those yet to be described below may be combined with each other unless noted to the contrary.

BRIEF DESCRIPTION OF THE DRAWINGS

The foregoing and other features and advantages of the disclosed embodiments will become further apparent from the following detailed description read in conjunction with the accompanying drawings. In the drawings, like reference numerals refer to like elements.

DETAILED DESCRIPTION

Figure 1:
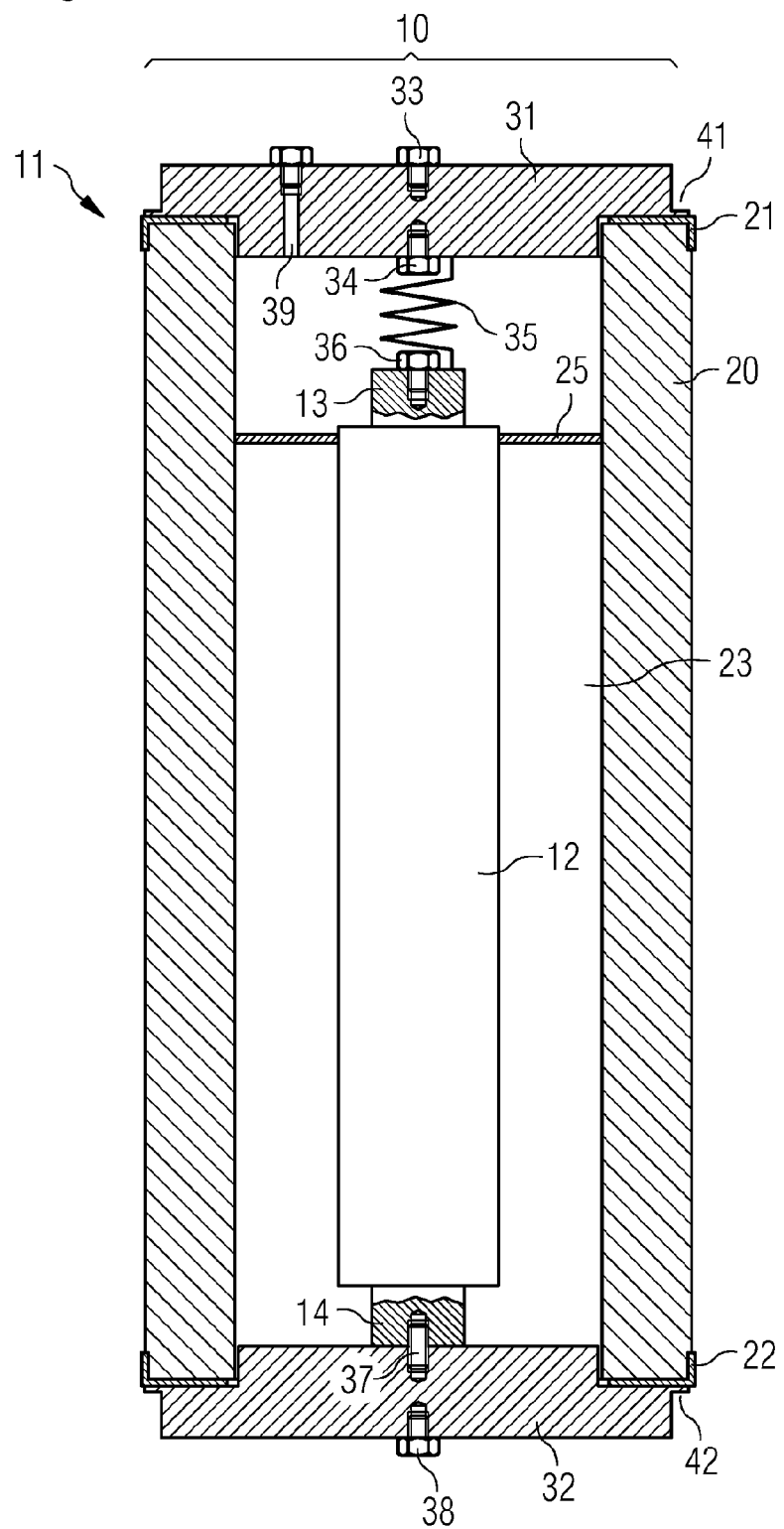
FIG. 1 is a schematic drawing showing a sectional side view of a subsea electric component having a pressure resistant housing according to one embodiment.

In the following description, the embodiments illustrated in the accompanying drawings are described in more detail. It should be clear that the following description is only illustrative and non-restrictive. The drawings are only schematic representations, and elements in the drawings are not necessarily to scale with each other.

FIG. 1 shows schematically a subsea electric component 10 that includes a pressure resistant housing 11 and an electric component 12 arranged inside the pressure resistant housing 11. The subsea electric component 10 may be installed in a subsea application having a pressure compensated enclosure, such as a transformer, a switch gear, a subsea variable speed drive. Pressure compensated is used herein to indicate that the enclosure of the subsea application is filled with a dielectric liquid and is provided with a pressure (or volume) compensator, via which a pressure equalization between the external pressure of surrounding sea water and the internal pressure of the dielectric liquid is established. If installed in such subsea application and positioned at the ocean floor, a pressure substantially equal to the water pressure at the ocean floor acts on the subsea electric component 10. As housing 11 is pressure resistant, the housing 11 may maintain a predefined inside pressure, e.g., a pressure close to one atmosphere, such as 1.5 bar. Accordingly, an electric component 12 suitable for the operation at atmospheric pressure may be installed in the pressure resistant housing 11 and may thus be used in the subsea application.

The pressure resistant housing 11 includes a ceramic housing body 20. In the example of FIG. 1, the ceramic housing body 20 has a cylindrical shape. In other embodiments, the shape of the ceramic housing body 20 may be different. The ceramic housing body 20 may have a cuboid shape with two open faces or other similar shapes. The ceramic material of the ceramic housing body 20 is very pressure resistant and has excellent electrical insulating properties. Any ceramic material that provides good pressure resistance and good insolating properties may be used for forming the ceramic housing body, such as alumina, zirconia or the similar materials.

In the embodiment of FIG. 1, the pressure resistant housing 11 includes a first metal lid 31 and a second metal lid 32 that close the openings at both ends of the cylindrically shaped ceramic housing body 20. The metal lids 31 and 32 are soldered, e.g., brazed, to the edge of the respective opening in the ceramic housing body 20.

The edges of the first and second openings in the ceramic housing body are metalized. In FIG. 1, a metallic layer 21 at the edge of the upper opening and a metallic layer 22 at the edge of the lower opening are provided on the ceramic housing body 20.

In FIG. 1, the edge of the respective opening is an annular plane face at which the ceramic housing body 20 ends. This annular face is at least partially covered with a circumferentially continuous metalized layer. As illustrated in FIG. 1, the metalized layers 21 and 22 may furthermore extend from the end face to the side wall of the ceramic housing body 20.

This may facilitate the soldering or brazing of the respective lid to the metal layer covering the edge of the ceramic housing body 20.

The metalized layers 21 and 22 on the ceramic housing body 20 may be formed in different ways. The respective metalized layer may be brazed onto the ceramic material. As an example, a moli-manganese metallization may be performed by applying a moli-manganese mixture to the ceramic housing body 20 and sintering the ceramic housing body 20 at high temperatures. The region impregnated in this way may then be plated with nickel. A wetting interface may thus be obtained. The wetting interface may facilitate soldering the respective metal lid to the metalized edge of the ceramic housing body 20. Another possibility is the deposition of a metal or metal alloy on the edge of the ceramic housing body 20. Using a cathodic arc plasma source, titanium may, for example, be deposited on the ceramic material. These and other techniques may be used in order to provide the metalized layers 21, 22 on the ceramic housing body 20.

The pressure resistant housing 11 includes a fluid tight seal 41, 42 between the respective metal lid 31, 32 and the ceramic housing body 20. The fluid tight seals 41, 42 are formed by soldering, e.g., brazing, the respective metal lid 31, 32 to the corresponding metalized layer 21, 22. The brazing operation forms the metallic, fluid tight seals 41, 42. This results in the lids 31, 32 being fixed to the ceramic housing body 20, and a seal that may withstand considerable pressure differences. As the metalized layers 21, 22 are continuous in a circumferential direction, the cylindrical housing is completely sealed when both lids 31, 32 are brazed to the ceramic housing body 20.

As mentioned above, the pressure internal to the pressure resistant housing 11 may be adjusted to fall in a range between 1 and 5 bar, e.g., close to 1.5 bar. When mounted inside a pressure compensated subsea application and deployed at a subsea installation, a pressure difference between the ambient pressure surrounding the pressure resistant housing 11 and the internal pressure inside the pressure resistant housing 11 may result. Subsea installations may be located at depths of up to 1000, 2000 or 3000 meters below sea level, e.g., in a range between 1000 and 3000 meters of water depth. For example, at a depth of 3000 meters, the pressure in the sea water surrounding the subsea application is about 300 bar, resulting in a corresponding ambient pressure around the pressure resistant housing 11 of about 300 bar. The pressure difference between the ambient pressure and the internal pressure is thus also close to 300 bar. The fluid tight metal seals 41 and 42 enable the pressure resistant housing 11 to withstand such high pressure differences, and to maintain its predefined internal pressure even at such installation depths. Depending on the type and quality of the metalized layers 21, 22 and of the fluid tight metal seals 41, 42 formed therewith, the pressure resistant housing 11 may be adapted to withstand pressure differences in a range between 1 and 100 bar, 1 and 200 bar, or 1 and 300 bar. Electric component 12 may thus be operated at a close to atmospheric pressure even if the subsea electric component 10 is installed in a pressurized environment at the above-mentioned water depths.

Metal lids 31 and 32 are further adapted to provide electric connections to the electric component 12. Electric component 12 has electric terminals 13 and 14 for electrically contacting the electric component. In the example of FIG. 1, the electric terminal 14 is mechanically fixed and electrically connected to the metal lid 32 via a screw connection using a threaded bolt 37. The electrical terminal 13 on the other hand is connected to the first metal lid 31 via a metal band 35. The metal band 35 is attached to the metal lid 31 by a first bolt 34 and to the electric terminal 13 via a second bolt 36.

In the embodiment of FIG. 1, the metal lids 31 and 32 are electrically connected to the electric component 12 and thus themselves act as electric terminals for the subsea electric component 10. The connection to the subsea application in which the subsea electric component 10 is installed may be provided by connecting elements 33 and 38, which, in the example of FIG. 1, are implemented as screw connections. The connecting elements 33 and 38 may be implemented in different ways. Because the housing body 20 is made of ceramic material, a good electric insulation is provided between the two metal lids 31 and 32 acting as electric terminals. A simple and effective configuration of the pressure resistant housing 11 may thus be achieved.

In other embodiments, it is also conceivable not to electrically connect the metal lids 31, 32 to the electric component 12, e.g., by providing penetrators or through connectors in the respective metal lid, which feed a conductor through the metal lid without electrically contacting the metal lid. The electric insulation of the electric component 12 may thus be improved, although the design of the metal lids 31, 32 may be more complex.

FIG. 1 shows the pressure resistant housing 11 in an assembled state, in which the metal band 35 is folded in as schematically illustrated. Accordingly, during assembly, the metal band 35 may be affixed to the upper terminal 13 of the electric component 12 and to the metal lid 31 when the metal lid 31 is not yet closed. This configuration gives access to the connecting bots before the lid is installed. Assembly is thus facilitated.

Figure 2:
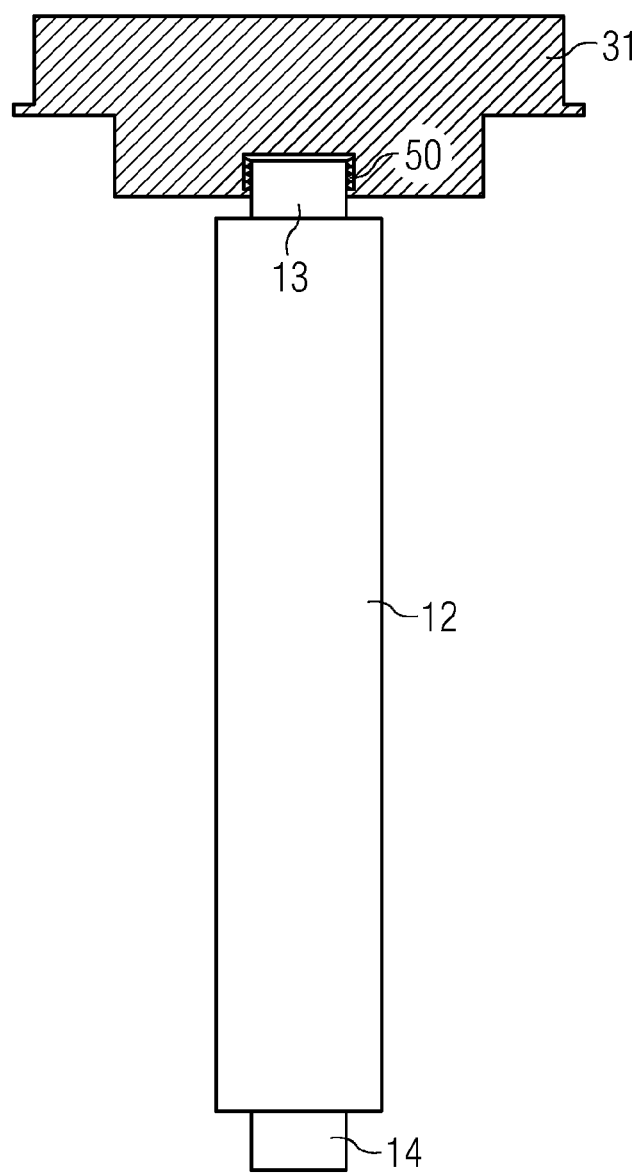
FIG. 2 is a schematic drawing of a partial sectional side view of a subsea electric component according to an embodiment in which an electric component may be mounted to a metal lid.

Other possibilities of providing an electric connection between the terminals of the electric component 12 and the metal lids 31, 32 are conceivable and may be used in the subsea electric component 10. One example is a push-in connector as illustrated in FIG. 2. The push-in connector includes a recess in the respective metal lid (e.g., the metal lid 31 in the example of FIG. 2). A flexible contact spring 50 is provided in the recess. For electrically contacting the terminal 13 of electric component 12 and for providing a mechanical mount, the terminal 13 is pushed into the recess in metal lid 31, where the terminal 13 is held and electrically contacted by the flexible spring 50. The flexible spring 50 may apply a force in a longitudinal direction of electric component 12 to the terminal 13, ensuring a good electrical contact and securing the electric component 12 in place. In other configurations, flexible spring 50 may apply a force in a radial direction toward the center of electrical terminal 13, which similarly establishes (e.g., ensures) a good electric contact and fixes the electric component 12 in place.

Other connecting elements for providing an electric contact to electric component 12 may also be used, such as a clamping element or the like. The push-in connector is useful in that the electric component 12 may be mounted easily and that the connector may be used in both metal lids 31, 32, as the electric component 12 is automatically contacted and held in place when closing the metal lid.

Optionally, a support element 25 may be provided inside the pressure resistant housing 11 for supporting electric component 12. In the example of FIG. 1, support element 25 has the shape of an annular disc, which secures the electric component 12 in position, thus establishing (e.g., ensuring) a spacing between the electric component 12 and the side walls of the pressure resistant housing 11.

The pressure resistant housing 11 may be at least partially filled with a medium 23. The medium may, for example, be sand, silicon gel, a dielectric liquid or other materials. The space between the electric component 12 and the ceramic housing body 20 may be filled with the medium. The medium may provide a better heat conduction, thus cooling the electric component 12. Furthermore, for example, if electric component 12 is implemented as a fuse or fuse element, it may reduce or prevent arcing.

Pressure resistant housing 11 may fully or partially be filled with the medium 23. In other embodiments, the pressure resistant housing 11 may fully or partially be filled with a gas, such as nitrogen, $SF_6$, air or other similar gases.

In the embodiment of FIG. 1, the pressure resistant housing 11 is partially filled with a gas and with a medium 23. The support element 25 provides a separation of the pressure resistant housing 11 into two compartments, one of which is filled with the medium 23 and the other of which is filled with a gas. For example, the compartment including the main body (or main part) of electric component 12 is filled with the medium 23. The gas filled compartment may establish a substantially constant internal pressure (e.g., ensure that the internal pressure remains almost constant), and the medium filled compartment may provide (e.g., ensure) cooling and electric isolation of the electric component 12.

After assembly of the subsea electric component 10, the tightness of the metal seals 41, 42 may be tested. For this purpose, the metal lid 31 includes a test port 39. The test port includes a channel reaching through lid 31 into the interior of the pressure resistant housing 11. Via the test port, a gas, such as helium, may be injected into the pressure resistant housing 11. To check the tightness of seals 41 and 42, helium leaking out of pressure resistant housing 11 may be detected with appropriate equipment. If no helium leakage is detected, the pressure resistant housing may be partially or fully filled with another gas, such as the above-mentioned nitrogen, SF6 or air, and the test port may be closed, for example, with a bolt as illustrated in FIG. 1. The test port is optional.

Electric component 12 may be a simple component such as a fuse or a fuse element, or electric component 12 may be a more complex component including electronic circuitry or the like. A surge arrestor may, for example, be mounted inside the pressure resistant housing 11, for preventing excessive currents in the subsea application. Any type of electric component that calls for operation at close to atmospheric pressures may benefit from the pressure resistant housing 11. The pressure resistant housing 11 thus enables the use of a wide range of standard electric components in the subsea application.

Figure 3:
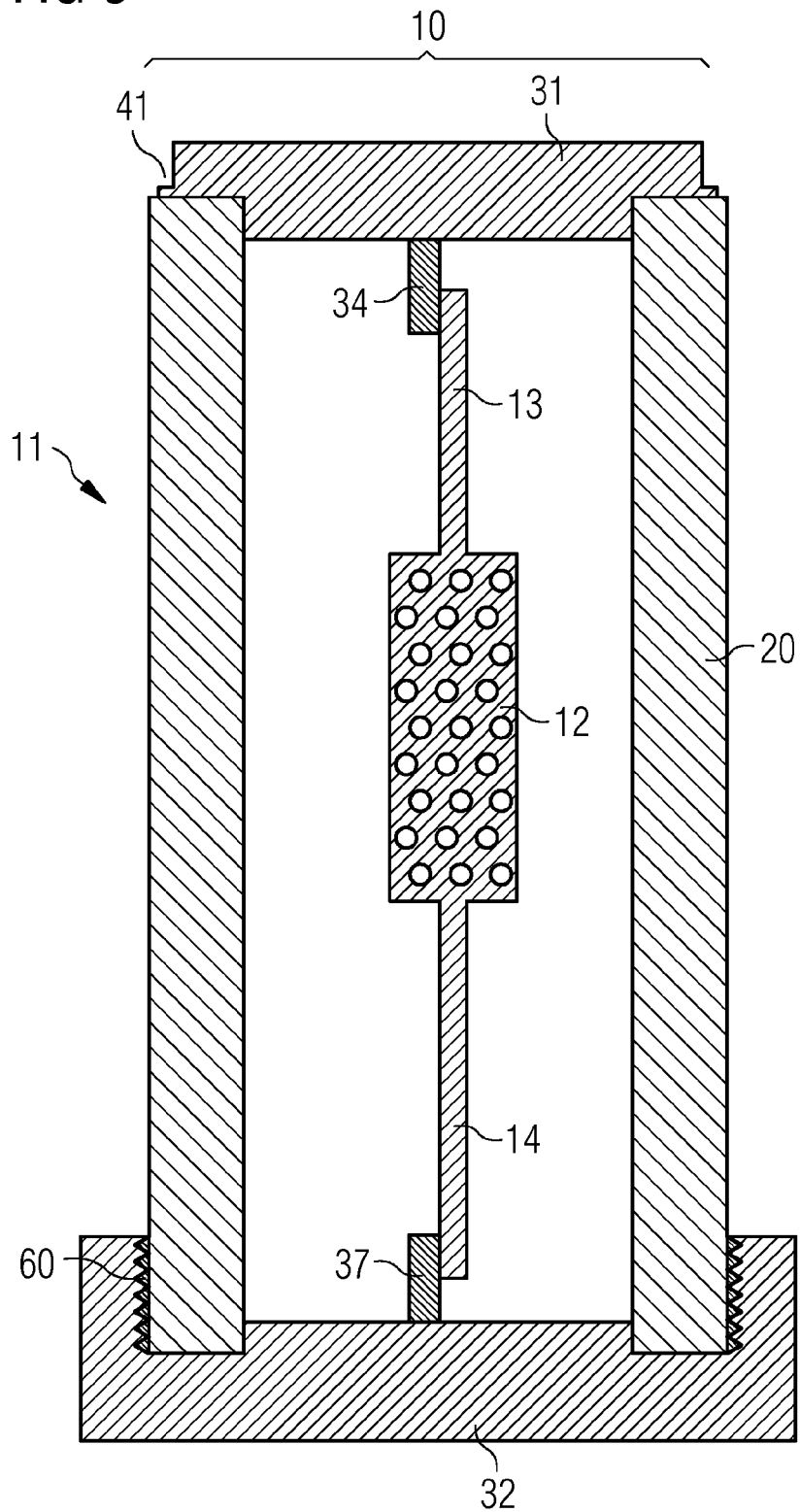
FIG. 3 is a schematic drawing showing a sectional side view of a subsea electric component according to one embodiment.

FIG. 3 shows a modification of the subsea electric component 10 of FIG. 1, and accordingly, the explanations given above with respect to FIG. 1 apply correspondingly to the subsea electric component 10 of FIG. 3. In the example of FIG. 3, the electric component 12 is a fuse element. The pressure resistant housing 11 may thus be filled with a material that is commonly used in fuse housings, such as sand. Accordingly, the subsea electric component 10 of FIG. 3 is essentially a subsea fuse that may be used in high pressure environments.

Furthermore, the second metal lid 32 is affixed to the ceramic housing body 20 via a screw or threaded connection 60. For example, an internal thread is provided on the metal lid 32, and an external thread is provided at the end of the ceramic housing body 20. The external thread on the ceramic housing body may be provided in a process similar to the one described above, e.g., by metallization and brazing. Other configurations are certainly also conceivable. As an example, ceramic housing body 20 may include an internal thread into which the metal lid 32 is screwed. The fluid tight seals between the metal lids 31, 32 and the ceramic housing body 20 may also be provided by brazing as described with respect to FIG. 1. In FIG. 1, the connection of the electric terminals 13, 14 of the fuse element to the respective metal lid are only illustrated schematically. Any of the above-mentioned means may be used for these connections. For one of the metal lids, the electric terminal may be soldered or brazed to a protrusion on the inner face of the metal lid, as illustrated. The other terminal may contact the other metal lid by a contacting element that facilitates the assembly of the pressure resistant housing, such as a metal band.

Features of the embodiments described above may be combined. The subsea electric component 10 of FIG. 1 may, for example, be provided with one or two screw-on lids, as shown in FIG. 3, or may include a fuse element as electric component 12. The subsea electric component 10 of FIG. 3 may be provided with two metal lids 31, 32 that are soldered or brazed to the ceramic housing body 20, e.g., as in FIG. 1. The fluid tight seal between the metal lid and the ceramic housing body may also be formed by a gasket for one or both metal lids of each embodiment. Flanges may be provided at the respective end of the ceramic housing body and at the metal lid, and the flanges may be clamped to each other, e.g., by clamping elements, bolts and nuts, rivets or other fastening members.

In summary, a compact pressure resistant housing is provided that may house an electric component, such as a standard fuse and that provides a fluid tight sealing, e.g., at high external pressures. Due to the compact size and the possibility to operate under high pressures, the pressure resistant housing enables the use of standard electric components in a subsea application operated at great depths of water.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A pressure resistant housing for an electric component to enable use of the electric component in a subsea application, the pressure resistant housing comprising:
    a ceramic housing body to house the electric component, the ceramic housing body having a first opening and a second opening;

a first metal lid to close the first opening in the ceramic housing body, the first metal lid establishing a fluid tight seal with the ceramic housing body at the first opening; and a second metal lid to close the second opening in the ceramic housing body, the second metal lid establishing a fluid tight seal with the ceramic housing body at the second opening;

wherein the ceramic housing body provides electric insulation between the first metal lid and the second metal lid, and wherein each metal lid provides an electric connection for electrically contacting the electric component inside the pressure resistant housing, and wherein the pressure resistant housing is configured to have a predefined internal pressure in a range between 1 bar and 5 bar and to maintain the predefined internal pressure up to a pressure difference of at least 10 bar between the internal pressure and an ambient pressure.

2. The pressure resistant housing of claim 1, wherein the ceramic housing body comprises a cylindrical ceramic tube, the first and second openings being disposed at opposing first and second ends of the ceramic tube.

3. The pressure resistant housing of claim 2, wherein end faces of at least one of the first or second ends of the cylindrical ceramic tube are metalized, each metalized end face providing a metalized annular face that abuts the respective first or second metal lid.

4. The pressure resistant housing of claim 1, wherein edges of the first and second openings in the ceramic housing body are metalized.

5. The pressure resistant housing of claim 1, wherein at least one of the first and second metal lids is soldered to a metalized edge of one of the first and second openings, respectively, to establish the fluid tight seals.

6. The pressure resistant housing of claim 1, wherein at least one of the fluid tight seals is established by a threaded connection or a screw connection between the respective first or second metal lid and the ceramic housing body.

7. The pressure resistant housing of claim 1, further comprising a support element arranged in the ceramic housing body and configured to support the electric component in the ceramic housing body.

8. The pressure resistant housing of claim 7, wherein the support element provides a spacing between the electric component and the ceramic housing body.

9. The pressure resistant housing of claim 1, wherein at least one of the first and second metal lids comprises a connecting element on a side of the respective metal lid that faces an interior of the pressure resistant housing to provide an electric contact to the electric component.

10. The pressure resistant housing of claim 9, wherein the connecting element is selected from the group consisting of a screw connection, a clamping element, and a push-in connector.

11. The pressure resistant housing of claim 1, wherein the pressure resistant housing is at least partially filled with nitrogen, $SF_6$, sand, silicone gel, a dielectric liquid, or a combination thereof.

12. The pressure resistant housing of claim 1, wherein at least one of the first or second metal lids comprises a test port configured to enable admission of a gas into the pressure resistant housing.

13. The pressure resistant housing of claim 1, wherein the pressure resistant housing is configured to enable operation of the electric component at close to atmospheric pressure even if the pressure resistant housing including the electric component is installed in a subsea application located at an ocean floor and having a pressure compensated enclosure.

14. The pressure resistant housing of claim 1, wherein at least one of the first and second metal lids is brazed to a metalized edge of one of the first and second openings, respectively, to establish the fluid tight seals.

15. A subsea electric component for a subsea application, the subsea electric component comprising:

a pressure resistant housing; and an electric component arranged in the pressure resistant housing;

wherein the pressure resistant housing comprises:
  a ceramic housing body to house the electric component, the ceramic housing body having a first opening and a second opening;
  a first metal lid to close the first opening, the first metal lid establishing a fluid tight seal with the ceramic housing body at the first opening; and
  a second metal lid to close the second opening, the second metal lid establishing a fluid tight seal with the ceramic housing body at the second opening;

wherein the ceramic housing body provides electric insulation between the first metal lid and the second metal lid, and wherein each metal lid provides an electric connection for electrically contacting the electric component inside the pressure resistant housing; and wherein the pressure resistant housing is configured to have a predefined internal pressure in a range between 1 bar and 5 bar and to maintain the predefined internal pressure up to a pressure difference of at least 10 bar between the internal pressure and an ambient pressure.

16. The subsea electric component of claim 15, wherein the electric component is selected from the group consisting of a fuse, a fuse element, and a surge arrester.

17. The subsea electric component of claim 16, wherein the fuse is configured as a low or medium voltage fuse.

18. The subsea electric component of claim 15, wherein the electric component has a first electrical terminal connected to the first metal lid and a second electrical terminal connected to the second metal lid.

19. The subsea electric component of claim 18, wherein one of the first and second electrical terminals is connected to the first or second metal lid via a flexible connection strip, a metallic band or a push-in connector.

20. A subsea fuse for a subsea application, the subsea fuse comprising:

a pressure resistant housing; and an electric component configured as a fuse element or a fuse and arranged in the pressure resistant housing;

wherein the pressure resistant housing comprises:
  a ceramic housing body to house the electric component, the ceramic housing body having a first opening and a second opening;
  a first metal lid to close the first opening, the first metal lid establishing a fluid tight seal with the ceramic housing body at the first opening; and
  a second metal lid to close the second opening, the second metal lid establishing a fluid tight seal with the ceramic housing body at the second opening;

wherein the ceramic housing body provides electric insulation between the first metal lid and the second metal lid, and wherein each metal lid provides an electric connection for electrically contacting the electric component inside the pressure resistant housing;

wherein the pressure resistant housing is configured to have a predefined internal pressure in a range between 1 bar and 5 bar and to maintain the predefined internal pressure up to a pressure difference of at least 10 bar between the internal pressure and an ambient pressure; and wherein the electric component comprises first and second electric terminals electrically connected to the first metal lid and the second metal lid, respectively.

* * * * *